United States Patent [19]

Schmidt

[11] 4,072,556
[45] * Feb. 7, 1978

[54] DEVICE FOR CRUCIBLE-FREE FLOATING-ZONE MELTING OF A CRYSTALLINE ROD AND METHOD OF OPERATING THE SAME

[75] Inventor: Otto Schmidt, Erlangen, Germany

[73] Assignee: Siemens Aktiengesellschaft, Berlin and Munich, Germany

[*] Notice: The portion of the term of this patent subsequent to Feb. 7, 1993, has been disclaimed.

[21] Appl. No.: 297,903

[22] Filed: Oct. 16, 1972

Related U.S. Application Data

[63] Continuation of Ser. No. 93,649, Nov. 30, 1970, abandoned.

[30] Foreign Application Priority Data

Nov. 29, 1969 Germany .............................. 1960089

[51] Int. Cl.² ............................................. B01J 17/10
[52] U.S. Cl. .................................. 156/620; 23/273 SP
[58] Field of Search ......... 23/301 SP, 273 SP, 273 Z; 156/617 SP, 620

[56] References Cited

U.S. PATENT DOCUMENTS

| 3,179,502 | 4/1965 | Rummel | 23/301 |
| 3,216,805 | 11/1965 | Emeis | 23/301 |
| 3,539,305 | 11/1970 | Keller | 23/301 |
| 3,622,282 | 11/1971 | Keller | 23/301 |

FOREIGN PATENT DOCUMENTS

| 221,138 | 5/1962 | Austria | 23/273 |

*Primary Examiner*—Norman Yudkoff
*Assistant Examiner*—Barry I. Hollander
*Attorney, Agent, or Firm*—Herbert L. Lerner

[57] ABSTRACT

Device for crucible-free zone melting a crystalline rod, end-supported by holders, one of the holders being rotatable about the longitudinal axis thereof, includes an induction heating coil disposed between the end holders and coaxial to the longitudinal axis, the induction heating coil being energizable for heating a molten zone formed in the crystalline rod and comprising at least one winding disposed in a single plane, and a connecting lead to the induction heating coil, the connecting lead being formed as a partial winding and disposed outside the plane on a side thereof facing the rotatable holder; and method of operating the device.

4 Claims, 2 Drawing Figures

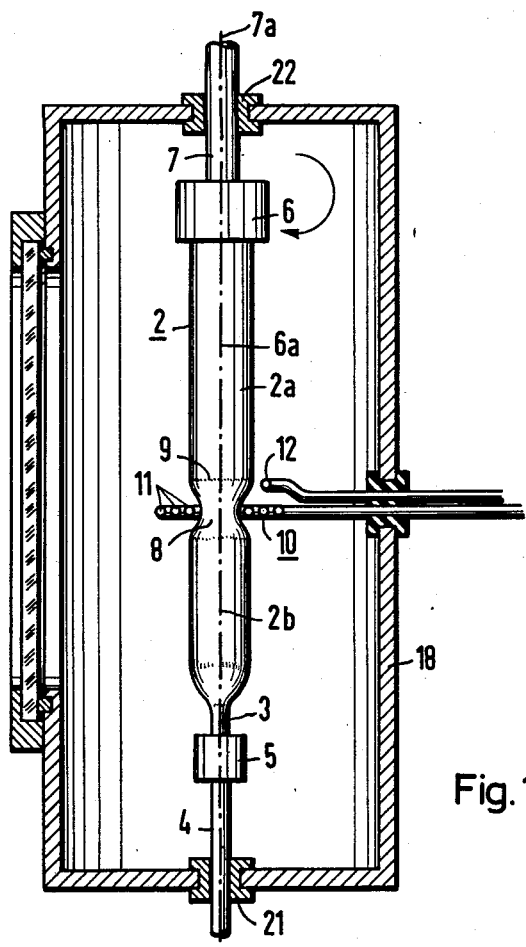
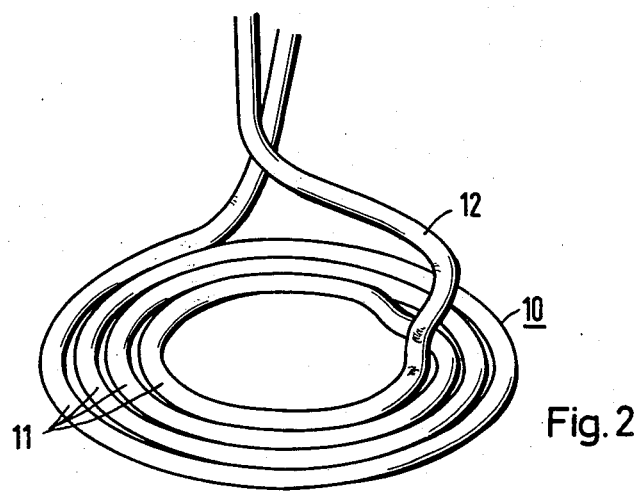
Fig. 1
Fig. 2

DEVICE FOR CRUCIBLE-FREE FLOATING-ZONE MELTING OF A CRYSTALLINE ROD AND METHOD OF OPERATING THE SAME

This is a continuation, of application Ser. No. 93,649, filed Nov. 30, 1970, now abandoned.

My invention relates to device for crucible-free zone melting a crystalline rod, especially a semiconductor rod, which is end-supported by holders of which one holder is rotatable about the longitudinal axis thereof, and which includes an induction heating coil surrounding the longitudinal axis of the rotatable holder for heating a melting zone formed in the crystalline rod, the windings of the induction heating coil being disposed in a single plane; and method for operating this device.

There are disclosed in Application Ser. No. 853,596 of W. Keller et al, filed Aug. 19, 1969, now U.S. Pat. No. 3,658,598 this application being assigned to the same assignee as the assignee of the instant application, and in U.S. Pat. No. 3,477,811 of W. Keller, methods and devices for crucible-free zone melting a crystalline rod with a flat induction heating coil whose windings are disposed in a single plane. By means of relative motion between the vertically disposed rod and the induction heating coil surrounding this rod in direction of the longitudinal axis of the crystalline rod, a molten zone is passed through the crystalline rod starting from the location at which a mono crystalline seed crystal is fused to the lower end of the crystalline rod.

In this disclosure of heretofore known art, both rod holders or only one of the rod holders, especially the rod holder which supports the rod portion that is to be zone melted, are set into rotation about the longitudinal axis thereof. By means of the crucible-free zone-melting operation which is carried out, the crystalline rod is transformed into a monocrystal, and specific impurities are removed therefrom. A flat induction heating coil having windings that are disposed in a single plane, has the advantage that it produces a relatively short or narrow molten zone in the crystalline rod. This reduces the danger of the dripping of molten material from the molten zone, especially in the case where relatively thick crystalline rods are being zone-melted by a crucible-free method.

This danger can even be further reduced if the inner diameter of the flat induction heating coil is smaller than the diameter of the crystalline starting rod that is to be melted, because, in such case, a narrowed-down molten zone with relatively little liquid melt is formed.

When crucible-free zone-melting especially thick crystalline rods with a flat induction heating coil, points or projections of hardened or solid material are formed at the boundary of the molten zone at the surface of the rod portion that is to be zone-melted, those points or projections extending out of the melt of the molten zone and increasing during the course of the molten zone pass through the crystalline starting rod. If the inner diameter of the flat induction heating coil is smaller than the diameter of the crystalline starting rod, these solid points or projections finally come in contact with the induction heating coil and cause a short circuit which interrupts the zone melting operation. If the inner diameter of the flat induction heating coil, on the other hand, is greater than the diameter of the rod portion that is to be zone melted, these points or projections are loosened from the boundary of the molten zone without completely melting and travel through the molten zone to the recrystallization front at the recrystallized rod portion where they are incorporated into the crystalline structure of this rod portion and form disturbances or dislocations in the monocrystalline structure of this recrystallized rod portion.

It is accordingly an object of my invention to provide device for crucible-free zone-melting a crystalline rod which prevents the formation of the aforementioned points or projections during a crucible-free zone-melting operation of a crystalline rod. With foregoing and other objects in view, I provide in accordance with the invention, device for crucible-free zone melting a crystalline rod, end-supported by holders, one of the holders being rotatable about the longitudinal axis thereof, including an induction heating coil disposed between the end holders and coaxial to the longitudinal axis, the induction heating coil being energizable for heating a molten zone formed in the crystalline rod and comprising at least one winding disposed in a single plane, and a connecting lead to the induction heating coil, the connecting lead being formed as a partial winding and disposed outside the plane on a side thereof facing the rotatable holder.

By means of the field emanating from the partial windings, the boundary of the molten zone at the surface of the rod portion that is to be zone melted, is additionally heated and the formation of the aforementioned points or projections of solidified material, is avoided. Hardened or solid points or projections at the edge or boundary of the molten zone with the crystalline rod that is to be melted, are avoided when the portion of the crystalline rod that is to be melted is secured in the rotatable holder that is located on the same side of the plane of the coil windings as the one on which the partial winding is located, and when this rotatable holder is then advantageously rotated at a speed within the range of 0.1 to 1 r.p.m., especially from 0.3 to 0.4 r.p.m., in direction of the partial winding of the induction heating coil or the main windings of the induction heating coil, about the longitudinal axis of the rotatable holder.

Other features which are considered as characteristic for the invention are set forth in the appended claims.

Although the invention is illustrated and described herein as device for crucible-free floating-zone melting of a crystalline rod and method of operationg the same, it is nevertheless not intended to be limited to the details shown, since various modifications may be made therein without departing from the spirit of the invention and within the scope and range of equivalents of the claims.

The invention, however, together with additional objects and advantages thereof will be best understood from the following description when read in connection with the accompanying drawing, in which:

FIG. 1 is a vertical sectional view of the device for crucible-free floating-zone melting of a crystalline rod according to my invention; and FIG. 2 is a fragmentary enlarged perspective view of FIG. 1 showing the induction heating coil thereof.

Referring now to the drawing and first, particularly, to FIG. 1 thereof, there is shown therein the device for crucible-free floating-zone melting which includes a receptacle 18 which is either evacuated or filled with protective gas such as nitrogen or argon, for example, and provided with wall entrances 21 and 22, suitably sealed by grommets through which mutually adapted drive shafts 4 and 7 extend. The drive shafts 4 and 7 carry end rod holders 5 and 6 at the ends thereof located within the receptacle 18, and are rotatable about their longitudinal axes as well as being displaceable in the axial direction thereof. The device shown in FIG. 1 is provided furthermore with a flat induction heating coil 10 whose windings 11 are disposed in one plane extending perpendicularly to the longitudinal axis 6a of the rod holder 6 and which surrounds the aligned longitudinal axes 6a and 7a of the holder 6 and the shaft 7, respectively. The induction heating coil 10 is energized with high frequency alternating current by a non-illustrated high frequency generator.

As shown in FIG. 2, the connecting lead to the inner winding of the induction heating coil 10, is formed as a partial winding 12 which is disposed in a plane parallel to the plane in which the windings 11 of the induction heating coil are disposed. The partial winding 12 extends over an arc or subtends an angle in the range from π/4 (45°) to π(180°) as measured in a plane perpendicular to the axis of the induction heating coil 10, with the vertex of the subtended angle being located in the axis. Preferably, the partial winding 12 is a quarter winding i.e., it extends over an arc or subtends an angle of π/2 or 90°. If the diameter of the rod portion 2a that is to be zone-melted is greater than the inner diameter of the induction heating coil 10, the radius of the partial winding 12 is advantageously greater than the radius of the inner winding. If the diameter of the rod portion that is to be melted is smaller, however, than the inner diameter of the induction heating coil, then the radius of the partial winding can be equal to or smaller than the radius of the inner winding of the induction heating coil. Instead of having a connecting lead at the radially innermost winding of the induction heating coil, the connecting lead can be provided at the radially outermost winding thereof as a partial winding located in a plane in which the windings 11 are disposed.

In the device of FIG. 1, a silicon rod 2 is vertically oriented with a monocrystalline seed crystal 3 fused to the lowwer end thereof. The rod portion 2a that is to be zone melted, is clamped in the upper holder 6, which is rotatable, while the monocrystal 3 with the recrystallized rod portion 2b, is secured in the lower holder 5 which can also be rotatable. The partial winding 12 of the induction heating coil 10 is located between the rod holder 6 for the rod portion 2a that is to be melted and the induction heating coil 10, i.e., on the side of the plane at which the windings 11 of the induction heating coil 10 are disposed, which face the rod holder 6 in which the rod portion 2a which is to be zone melted, is clamped.

A molten zone 8 is produced with the aid of the induction heating coil 10 within the silicon rod 2 and is of reduced diameter with respect to the remainder of the rod 2 because the inner diameter of the induction heating coil 10 is smaller then the diameter of the rod portion 2a which is to be zone melted. Due to relative motion between the rod holders 5 and 6, on the one hand, and the induction heating coil 10, on the other hand, for example by displacing the rod holders downwardly from above, while maintaining the induction heating coil 10 stationary, the molten zone 8 is passed through the silicon rod 2, starting from the location at which the seed crystal 3 is fused to the silicon rod 2. The upper rod holder 6 is advantageously rotated about the longitudinal axis 6a thereof, at a rotary speed of 0.1 to 1 r.p.m., preferably at a speed of 0.3 to 0.4 r.p.m., in the direction of the partial winding 12 or the inner winding 11, i.e., clockwise as shown in FIG. 2, while the lower rod holder 5 can be set in rotation about its longitudinal axis in opposite rotational direction. The rotational speed of the rod holder 6 can be, for example, 0.35 r.p.m. The partial winding 12 located substantially at the level of the edge 9 of the molten zone at the rod holder 2a which is to be melted, heats the outer surface of the rod portion 2a at the edge 9 of the molten zone and thereby prevents the formation at that location of points or sharp projections of the solid material.

In order to zone melt, by the crucible-free method of this invention, a 33 mm thick silicon rod, the device of this invention can be provided, for example, with an induction heating coil 10, such as shown in FIG. 1, having a flat spiral coil with four windings, provided with inner diameter of 29 mm. The partial winding 12 extends over a quarter winding which is disposed in a plane extending parallel to the plane in which the windings 11 are disposed, and the partial winding 12 has a radius of about 20 mm. The spacing of the partial winding 12 from the plane in which the windings 11 are disposed, is about 10 mm. The molten zone 8 is passed through the silicon rod with a speed of 1 to 2 mm per minute.

In the device according to the invention, a recrystallized rod can also be obtained having a diameter that is smaller or larger than the diameter of the starting rod by carrying out a suitable relative displacement between the rod holders 5 and 6 during the pass of the molten zone through the crystalline starting rod. Thus, by relatively displacing the rod holders toward one another, the diameter of the crystallized rod can be increased, while by relatively displacing the rod holders away from one another, the recrystallized rod can be reduced in diameter.

The holder with the recrystallized rod portion can furthermore be set into rotation after producing the molten zone at the location at which the seed crystal is fused at the crystalline rod, and can be displaced laterally into a new starting position. During the pass of the molten zone through the crystalline rod, the holder for the recrystallized rod portion can, in addition, be successively reciprocated laterally about this new starting position. The dopant concentration in the recrystallized rod portion can accordingly be adjusted or evenly distributed and the crystal quality of the recrystallized rod portion thereby improved. It is accordingly advantageous to dispose the plane in which the windings 11 of the flat induction heating coil 10 are located, at an angle inclined to the longitudinal axis of the rod holders, i.e., so that the normals to the planes in which the windings 11 are disposed form with the longitudinal axis of the rod holders, an acute angle preferably in the range of 0.5° to 3°. Such a construction prevents periodic remelting and re-solidying of the recrystallized rod portion at the recrystallisation front due to non-uniform field distribution at the windings of the flat induction heating coil which has a disadvantageous effect upon the crystal quality of the rod. The new starting position for the holder to which the recrystallized rod portion is secured, is selected advantageously so that the longitudinal axis of this holder is located in the plane of the angle extending between the normals to the plane in which the windings 11 are disposed and the longitudinal axis of the other holder for the rod portion that is to be zone melted, within the acute angle enclosed or defined by the plane in which the windings 11 are disposed and the longitudinal axis of the holder for the rod portion to be melted, at the side of the plane in which the windings 11 are disposed which faces the holder that carries the recrystallized rod portion. For further details regarding the foregoing construction, reference can be had to my co-pending application Ser. No. 93,650 (F-5137) filed Nov. 30, 1970 now U.S. Pat. No. 3,716,341.

The device according to the invention has an advantage especially in that a rod shaped monocrystal of very good quality can be obtained by means of a single pass of the molten zone through the crystalline supply rod.

I claim:

1. Method of operating a device for crucible free zone melting a crystalline rod end-supported by holders, one of which is rotatable about the longitudinal axis thereof, the rod being surrounded by an induction heating coil energizable for heating a molten zone formed in the rod, the coil being formed of at least one winding disposed in a single plane and a connecting lead to the coil formed as a partial winding and disposed outside the plane on a side thereof facing a portion of the rod which is to be zone melted which comprises securing in the rotary holder the portion of the crystalline rod to be zone melted, rotating the rotary holder at a speed within the range of from 0.1 to 1 r.p.m. in the direction of winding of the induction heating coil from partial winding through the main winding of the induction heating coil, heating a molten zone in said rod by said induction heating coil, and heating the edge of said molten zone at the boundary between said molten zone and the portion of the rod which is to be zone melted, said edge being heated by said partial winding whereby the heating applied by said partial winding prevents formation of projections of solid material at said edge.

2. Method according to claim 1, wherein the rotary holder is rotated at a speed within the range of from 0.3 to 0.4 r.p.m.

3. In a device for crucible-free zone-melting a crystalline rod, end-supported by holders, an induction heating coil disposed between the end holders and coaxial to said longitudinal axis, said induction heating coil being energizable for heating a molten zone formed in the crystalline rod and comprising at least one winding disposed in a single plane, and a connecting lead to the induction heating coil, said connecting lead being formed as a partial winding and disposed outside said plane on a side thereof facing the portion of the rod which is to be zone melted, the end holder on the same side as the partial winding being mounted for rotation, said partial winding being disposed substantially at the edge of the molten zone at the boundary between said molten zone and the portion of the rod which is to be zone melted, said partial winding thereby preventing formation of projections of solid material at the edge of said molten zone.

4. Device according to claim 3 wherein said partial winding extends about said rod in the same generaal direction as said coil and subtends an angle within the range from about 45° to about 180°.

* * * * *